United States Patent
Chindo

(10) Patent No.: US 8,314,661 B2
(45) Date of Patent: Nov. 20, 2012

(54) ATOMIC OSCILLATOR

(75) Inventor: Koji Chindo, Kawasaki (JP)

(73) Assignee: Seiko Epson Corporation (JP)

( * ) Notice: Subject to any disclaimer, the term of this patent is extended or adjusted under 35 U.S.C. 154(b) by 37 days.

(21) Appl. No.: 12/916,696

(22) Filed: Nov. 1, 2010

(65) Prior Publication Data

US 2011/0109395 A1     May 12, 2011

(30) Foreign Application Priority Data

Nov. 12, 2009   (JP) ................................. 2009-258872

(51) Int. Cl.
    *H03L 7/26* (2006.01)
(52) U.S. Cl. ........................................... 331/94.1; 331/3
(58) Field of Classification Search .................. 331/94.1, 331/3; 372/32, 28
    See application file for complete search history.

(56) References Cited

U.S. PATENT DOCUMENTS

| | | | |
|---|---|---|---|
| 6,320,472 B1 | 11/2001 | Vanier | |
| 6,888,780 B2 * | 5/2005 | Happer et al. | 368/10 |
| 7,378,913 B2 * | 5/2008 | Laiacano et al. | 331/3 |

* cited by examiner

Primary Examiner — Joseph Chang
(74) Attorney, Agent, or Firm — Harness, Dickey & Pierce, P.L.C.

(57) ABSTRACT

An atomic oscillator using an electromagnetically induced transparency phenomenon caused by irradiation of a resonant light pair to an alkali metal atom, includes: a light source that generates a first light having a center frequency $f_1$ and a plurality of frequency components different from each other in frequency by $\Delta f$, and a second light having a center frequency $f_2$ and a plurality of frequency components different from each other in frequency by $\Delta f$; a light detection unit that detects intensities of lights including the first light and the second light passing through the alkali metal atom; and a control unit that controls, based on a detection result of the light detection unit, to cause a frequency difference between a specified frequency component of the first light and a specified frequency component of the second light to be equal to a frequency corresponding to an energy difference between two ground levels of the alkali metal atom, wherein a frequency difference between the center frequency $f_1$ of the first light and the center frequency $f_2$ of the second light is different from the frequency corresponding to the energy difference between the two ground levels of the alkali metal atom.

6 Claims, 14 Drawing Sheets

ATOMIC OSCILLATOR

The entire disclosure of Japanese Patent Application No. 2009-258872, filed Nov. 12, 2009 is expressly incorporated by reference herein.

BACKGROUND

1. Technical Field

The present invention relates to an atomic oscillator.

2. Related Art

An atomic oscillator based on an electromagnetically induced transparency (EIT) system (also called a coherent population trapping (CPT) system) is an oscillator using a phenomenon in which when two resonant lights different from each other in wavelength (frequency) are simultaneously irradiated to an alkali metal atom, the absorption of the two resonant lights is stopped.

It is known that the interaction mechanism between the alkali metal atom and the two resonant lights can be explained in a Λ-type three-level system model as shown in FIG. 13A. The alkali metal atom has two ground levels, and when resonant light 1 having a wavelength (frequency $f_1$) corresponding to an energy difference between the ground level 1 and the excited level or resonant light 2 having a wavelength (frequency $f_2$) corresponding to an energy difference between the ground level 2 and the excited level is individually irradiated to the alkali metal atom, light absorption occurs as is well known. However, as shown in FIG. 13B, when the resonant light 1 and the resonant light 2 in which the frequency difference $f_1-f_2$ accurately coincides with the frequency corresponding to the energy difference $\Delta E_{12}$ between the ground level 1 and the ground level 2 are simultaneously irradiated to the alkali metal atom, a superposition state of the two ground levels, that is, a quantum interference state occurs, the excitation to the excited level is stopped, and the transparency phenomenon (EIT phenomenon) occurs in which the resonant light 1 and the resonant light 2 pass through the alkali metal atom. This EIT phenomenon is used and an oscillator with high accuracy can be formed by detecting and controlling the abrupt change of light absorption behavior when the frequency difference $f_1-f_2$ between the resonant light 1 and the resonant light 2 shifts from the frequency corresponding to the energy difference $\Delta E_{12}$ between the ground level 1 and the ground level 2.

FIG. 14 is a schematic view of a general structure of a related art atomic oscillator of a CPT system. As shown in FIG. 14, the related art atomic oscillator of the CPT system modulates a drive current of a frequency $f_0$ ($=v/\lambda_0$: v is light speed, $\lambda_0$ is the center wavelength of laser light) generated by a current drive circuit with a modulation frequency $f_{m1}$ of ½ of a frequency corresponding to an energy difference $\Delta E_{12}$ between the ground level 1 and the ground level 2, so that a semiconductor laser generates a resonant light 1 having a frequency $f_1=f_0+f_{m1}$ and a resonant light 2 having a frequency $f_2=f_0-f_{m1}$ (FIG. 13B), and a gaseous alkali metal atom contained in an atomic cell causes the EIT phenomenon. In the atomic oscillator, the oscillation frequency of a voltage controlled crystal oscillator (VCXO) is controlled so that the detection amount of light passing through the atomic cell becomes maximum. A phase locked loop (PLL) multiplies the oscillation frequency by a multiplication ratio N/R (both N and R are positive integers) to generate a signal of the modulation frequency $f_{m1}$ of ½ of the frequency corresponding to $\Delta E_{12}$. According to the structure as stated above, since the voltage controlled crystal oscillator (VCXO) continues the oscillation operation very stably, the oscillation signal with very high frequency stability can be generated. Incidentally, the atomic cell here includes the gaseous alkali metal atom and the container containing this, and its description will be made below.

U.S. Pat. No. 6,320,472 is an example of related art.

However, in the related art atomic oscillator, the oscillator, such as the PLL, to generate the modulation frequency $f_{m1}$, which accurately coincides with the frequency of ½ of the frequency (for example, 9.19263 . . . GHz in the case of a cesium atom) corresponding to $\Delta E_{12}$, directly or by harmonics must be prepared specially, and the degree of freedom of design is restricted.

Besides, since stability is attained in the state where the modulation frequency $f_{m1}$ accurately coincides with the frequency of ½ of the frequency corresponding to $\Delta E_{12}$, in the related art atomic oscillator, according to the accuracy of the multiplication ratio N/R of the PLL, there is a case where the voltage controlled crystal oscillator (VCXO) can not be accurately oscillated at the desired frequency (nominal frequency). Thus, for example, when the oscillation frequency of the voltage controlled crystal oscillator (VCXO) is 9.999 MHz, a high accuracy frequency conversion circuit is required to obtain merely 10 MHz of the nominal frequency, and there is a case where the atomic oscillator can not be realized by a simple structure (see FIG. 14).

SUMMARY

An advantage of some aspects of the invention is to provide an atomic oscillator having a relatively simple structure by improving the degree of freedom of design.

According to an aspect of the invention, an atomic oscillator uses an electromagnetically induced transparency phenomenon caused by irradiation of a resonant light pair to an alkali metal atom. The atomic oscillator includes a light source that generates a first light having a center frequency $f_1$ and plural frequency components different from each other in frequency by $\Delta f$ and a second light having a center frequency $f_2$ and plural frequency components different from each other in frequency by $\Delta f$, a light detection unit that detects intensities of lights including the first light and the second light passing through the alkali metal atom, and a control unit that controls, based on a detection result of the light detection unit, to cause a frequency difference between a specified frequency component of the first light and a specified frequency component of the second light to be equal to a frequency corresponding to an energy difference between two ground levels of the alkali metal atom. A frequency difference between the center frequency $f_1$ of the first light and the center frequency $f_2$ of the second light is different from the frequency corresponding to the energy difference between the two ground levels of the alkali metal atom.

In the related art atomic oscillator of the CPT system, the control is made such that the frequency difference between two resonant lights coincides with the frequency corresponding to the energy difference between the two ground levels of the alkali metal atom. On the other hand, in the atomic oscillator of the aspect of the invention, the control is made such that the frequency difference between the specified frequency component of the first light and the specified frequency component of the second light becomes equal to the frequency corresponding to the energy difference between the two ground levels of the alkali metal atom. That is, the control is made such that the specified frequency component of the first light and the specified frequency component of the second light become two resonant lights (however, both of the center frequency $f_1$ of the first light and the center frequency $f_2$ of the second light do not become the resonant light).

In brief, in the atomic oscillator according to the aspect of the invention, the design is made such that a pair of the specified frequency component other than the center frequency $f_1$ of the first light and the specified frequency component other than the center frequency $f_2$ of the second light, or a pair of the center frequency $f_1$ of the first light and the specified frequency component other than the center frequency $f_2$ of the second light, or a pair of the specified frequency component other than the center frequency $f_1$ of the first light and the center frequency $f_2$ of the second light becomes the resonant pair.

Accordingly, according to the aspect of the invention, as compared with the related art atomic oscillator, the degree of freedom of design is improved, and the atomic oscillator having the relatively simple structure can be provided.

The atomic oscillator of the aspect of the invention may be configured such that the control unit includes a first modulation frequency generating unit that generates a first signal having a first modulation frequency $f_{m1}$ based on the detection result of the light detection unit, and a second modulation frequency generating unit that generates a second signal having a second modulation frequency $fm_2$, and the light source modulates a signal having a specified frequency $f_0$ based on the first signal and the second signal, and generates the first light and the second light satisfying equations of $f_1=f_0+f_{m1}$, $f_2=f_0-f_{m1}$ and $\Delta f=f_{m2}$.

According to the atomic oscillator according to the aspect of the invention, it is preferable that the frequency difference between the specified frequency component $(f_1+j\times\Delta f)$ of the first light and the specified frequency component $(f_2+k\times\Delta f)$ of the second light, that is, $(2\times f_{m1}+(j-k)\times f_{m2})$ (j and k are integers, and $j\neq k$) coincides with the frequency corresponding to the energy difference between the two ground levels of the alkali metal atom.

Accordingly, according to the aspect of the invention, when the first modulation frequency $f_{m1}$ and the second modulation frequency $f_{m2}$ satisfying the above condition are selected directly or by using a simple frequency divider so that the desired frequency is obtained, the atomic oscillator having the relatively simple structure can be realized.

The atomic oscillator of the aspect of the invention may be configured such that the second modulation frequency generating unit generates the second signal by frequency converting the first signal.

The atomic oscillator of the aspect of the invention may be configured such that the second modulation frequency generating unit oscillates at the second modulation frequency $f_{m2}$ independently of the first signal.

The atomic oscillator of the aspect of the invention may be configured to include a frequency conversion unit that frequency converts the first signal and generates the signal having the specified frequency.

The atomic oscillator of the aspect of the invention may be configured such that the control unit includes a second modulation frequency generating unit that generates a second signal having a second modulation frequency $f_{m2}$ based on the detection result of the light detection unit, and a first modulation frequency generating unit that generates a first signal having a first modulation frequency $f_{m1}$ by frequency converting the second signal, and the light source modulates a signal having a specified frequency $f_0$ based on the first signal and the second signal, and generates the first light and the second light satisfying equations of $f_1=f_0+f_{m1}$, $f_2=f_0-f_{m1}$ and $\Delta f=f_{m2}$.

According to the atomic oscillator according to the aspect of the invention, it is preferable that the frequency difference between the specified frequency component $(f_1+j\times\Delta f)$ of the first light and the specified frequency component $(f_2+k\times\Delta f)$ of the second light, that is, $(2\times f_{m1}+(j-k)\times f_{m2})$ (j and k are integers, and $j\neq k$) coincides with the frequency corresponding to the energy difference between the two ground levels of the alkali metal atom.

Accordingly, according to the aspect of the invention, when the first modulation frequency $f_{m1}$ and the second modulation frequency $f_{m2}$ satisfying the above condition are selected directly or by using a simple frequency divider so that the desired frequency is obtained, the atomic oscillator having the relatively simple structure can be realized.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments of the invention will be described in detail with reference to the drawings. Incidentally, the embodiments described below do not improperly limit the content of the invention recited in the claims. Besides, all components described below are not necessarily inevitable components of the invention.

Figure 1:
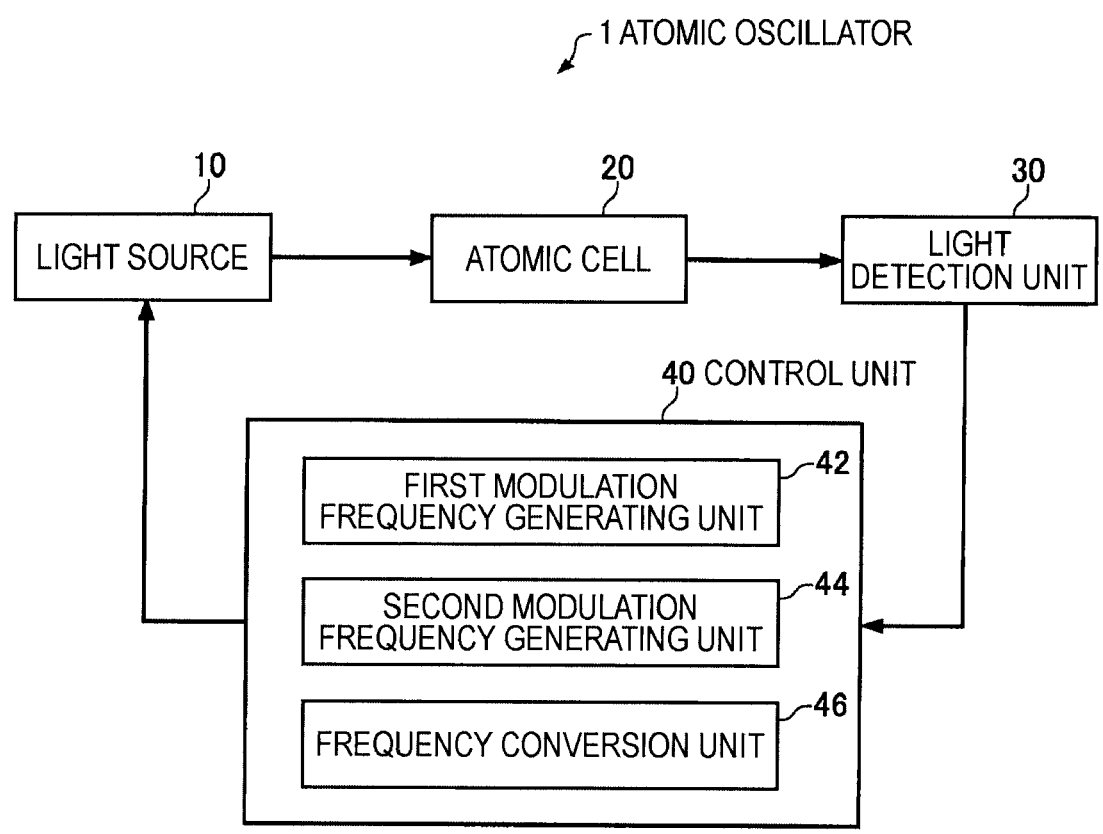
FIG. 1 is a functional block diagram of an atomic oscillator of an embodiment.

FIG. 1 is a functional block diagram of an atomic oscillator of an embodiment.

The atomic oscillator 1 of this embodiment includes a light source 10, an atomic cell 20, a light detection unit 30 and a control unit 40.

The light source 10 generates a first light having a center frequency $f_1$ and plural frequency components different from each other in frequency by $\Delta f$, and a second light having a center frequency $f_2$ and plural frequency components different from each other in frequency by $\Delta f$.

The atomic cell 20 contains gaseous alkali metal atoms, and is irradiated with the first light and the second light by the light source 10. Hereinafter, the first light and the second light are called "irradiation light 1" and "irradiation light 2".

The light detection unit 30 detects the intensities of lights including the irradiation light 1 and the irradiation light 2 passing through the alkali metal atom.

The control unit 40 controls, based on the detection result of the light detection unit 30, to cause a frequency difference between a specified frequency component of the irradiation light 1 and a specified frequency component of the irradiation light 2 to be equal to a frequency corresponding to an energy difference between two ground levels of an alkali metal atom. However, in this embodiment, a frequency difference between the center frequency $f_1$ of the irradiation light 1 and the center frequency $f_2$ of the irradiation light 2 does not coincide with the frequency corresponding to the energy difference between the two ground levels of the alkali metal atom.

That is, a pair of the specified frequency component other than the center frequency $f_1$ of the irradiation light 1 and the specified frequency component other than the center frequency $f_2$ of the irradiation light 2, or a pair of the center frequency $f_1$ of the irradiation light 1 and the specified frequency component other than the center frequency $f_2$ of the irradiation light 2, or a pair of the specified frequency component other than the center frequency $f_1$ of the irradiation light 1 and the center frequency $f_2$ of the irradiation light 2 is made the resonant pair, and control is performed such that the frequency difference coincides with the frequency corresponding to the energy difference between the two ground levels of the alkali metal atom.

As shown in FIG. 1, the control unit 40 includes a first modulation frequency generating unit 42 and a second modulation frequency generating unit 44.

For example, a structure may be made such that the first modulation frequency generating unit 42 generates a first signal having a first modulation frequency $f_{m1}$ based on the detection result of the light detection unit 30, and the second modulation frequency generating unit 44 generates a second signal having a second modulation frequency $f_{m2}$. Here, the second modulation frequency generating unit 44 may generate the second signal by frequency converting the first signal generated by the first modulation frequency generating unit 42, or may oscillate at the second modulation frequency $f_{m2}$ independently of the first signal. In the latter case, the control unit 40 may further include a frequency conversion unit to generate a signal having a specified frequency by frequency converting the first signal.

Besides, for example, a structure may be made such that the second modulation frequency generating unit 44 generates the second signal having the second modulation frequency $f_{m2}$ based on the detection result of the light detection unit 30, and the first modulation frequency generating unit 42 generates the first signal having the first modulation frequency $f_{m1}$ by frequency converting the second signal generated by the second modulation frequency generating unit 44.

In either case, the light source 10 modulates a signal having a specified frequency $f_0$ based on the first signal generated by the first modulation frequency generating unit 42 and the second signal generated by the second modulation frequency generating unit 44, and generates the irradiation light 1 and the irradiation light 2 satisfying equations of $f_1 = f_0 + f_{m1}$, $f_2 = f_0 - f_{m1}$ and $\Delta f = f_{m2}$.

Figure 2A:
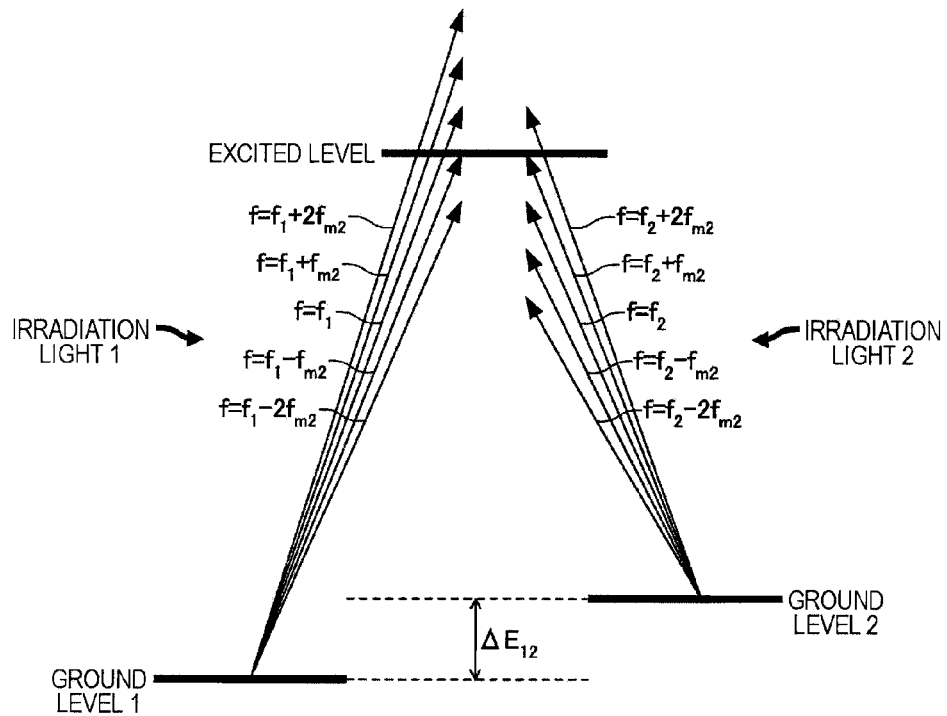
FIG. 2A is a view showing a first example of a Λ-type three-level model of an alkali metal atom and a relation between an irradiation light 1 and an irradiation light 2.
Figure 2B:
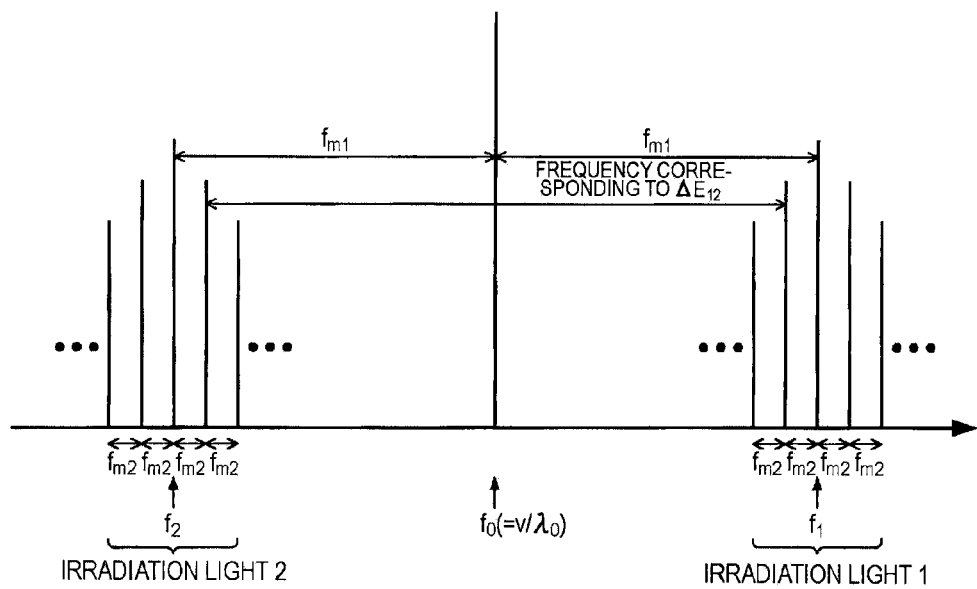
FIG. 2B is a view showing a first example of frequency spectra of the irradiation light 1 and the irradiation light 2.
Figure 3A:
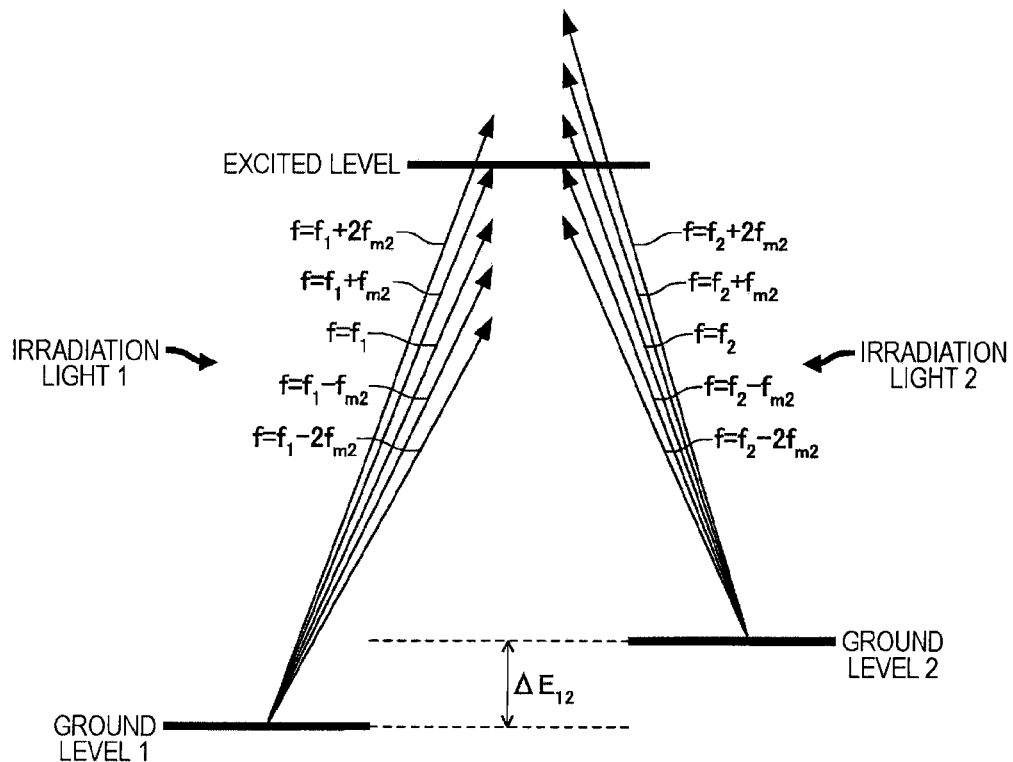
FIG. 3A is a view showing a second example of a Λ-type three-level model of an alkali metal atom and a relation between an irradiation light 1 and an irradiation light 2.
Figure 3B:
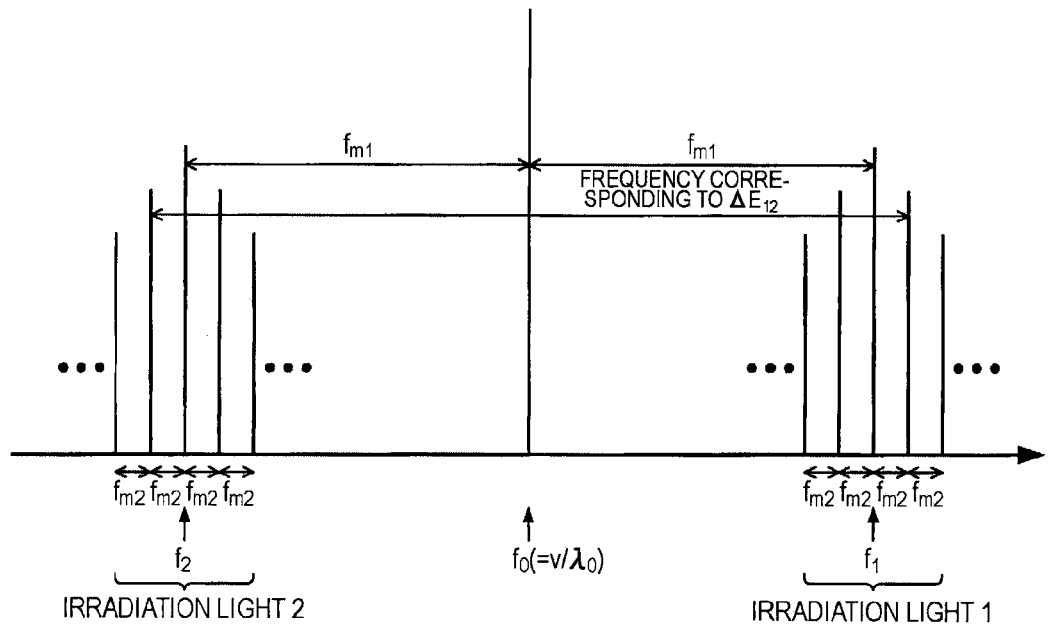
FIG. 3B is a view showing a second example of frequency spectra of the irradiation light 1 and the irradiation light 2.
Figure 4A:
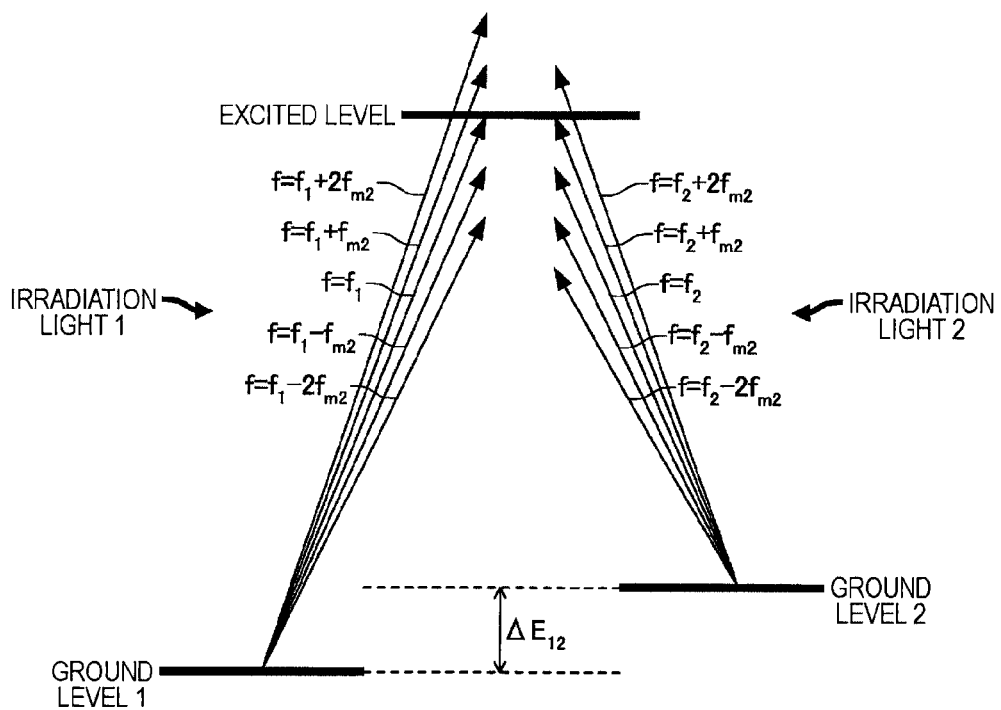
FIG. 4A is a view showing a third example of a Λ-type three-level model of an alkali metal atom and a relation between an irradiation light 1 and an irradiation light 2.
Figure 4B:
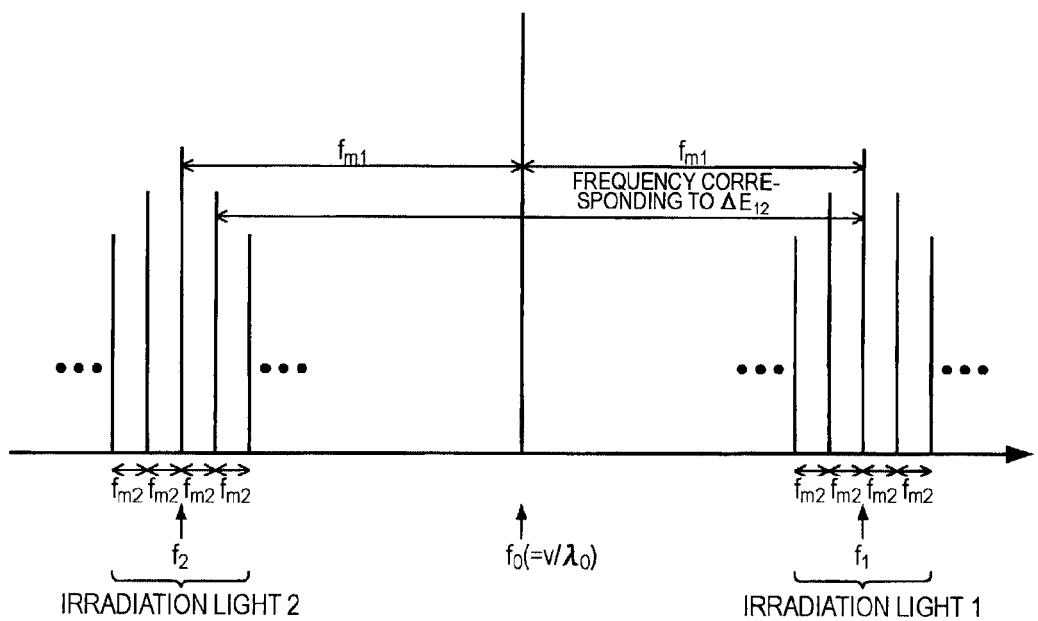
FIG. 4B is a view showing a third example of frequency spectra of the irradiation light 1 and the irradiation light 2.

FIG. 2A and FIG. 2B, FIG. 3A and FIG. 3B, and FIG. 4A and FIG. 4B are views for explaining a first, a second and a third examples of the irradiation light 1 and the irradiation light 2 generated in the atomic oscillator of this embodiment. FIG. 2A, FIG. 3A and FIG. 4A are views respectively showing a Λ-type three-level model of an alkali metal atom and a relation between the irradiation light 1 and the irradiation light 2. FIG. 2B, FIG. 3B and FIG. 4B are views respectively showing frequency spectra of the irradiation light 1 and the irradiation light 2.

As shown in FIG. 2B, FIG. 3B and FIG. 4B, in any of the first, the second and the third examples, the irradiation light 1 having plural frequency components different from each other in frequency by $f_{m2}$ exists in the upper side band with respect to the frequency $f_0$, ($= v/\lambda_0$), and the irradiation light 2 having plural frequency components different from each other in frequency by $f_{m2}$ exists in the lower side band. The center frequency of the irradiation light 1 is $f_1 = f_0 + f_{m1}$ and the center frequency $f_2$ of the irradiation light 2 is $f_2 = f_0 - f_{m1}$.

As shown in FIG. 2A and FIG. 2B, in the first example, a frequency difference between a frequency component $f_1 - f_{m2}$ of the irradiation light 1 and a frequency component $f_2 + f_{m2}$ of the irradiation light 2 coincides with the frequency corresponding to the energy difference $\Delta E_{12}$ between the ground level 1 and the ground level 2 of the alkali metal atom. Accordingly, the alkali metal atom causes the FIT phenomenon while the frequency component $f_1 - f_{m2}$ of the irradiation light 1 and the frequency component $f_2 + f_{m2}$ of the irradiation light 2 are a pair of resonant lights.

As shown in FIG. 3A and FIG. 3B, in the second example, a frequency difference between a frequency component $f_1 + f_{m2}$ of the irradiation light 1 and a frequency component $f_2 - f_{m2}$ of the irradiation light 2 coincides with the frequency corresponding to the energy difference $\Delta E_{12}$ between the ground level 1 and the ground level 2 of the alkali metal atom. Accordingly, the alkali metal atom cause the EIT phenomenon while the frequency component $f_1 + f_{m2}$ of the irradiation light 1 and the frequency component $f_2 - f_{m2}$ of the irradiation light 2 are a pair of resonant lights.

As shown in FIG. 4A and FIG. 4B, in the third example, a frequency difference between a center frequency $f_1$ of the irradiation light 1 and a frequency component $f_2 + f_{m2}$ of the irradiation light 2 coincides with the frequency corresponding to the energy difference $\Delta E_{12}$ between the ground level 1 and the ground level 2 of the alkali metal atom. Accordingly, the alkali metal atom causes the EIT phenomenon while the center frequency $f_1$ of the irradiation light 1 and the frequency component $f_2 + f_{m2}$ of the irradiation light 2 are a pair of resonant lights.

Hereinafter, a more specific structure of the atomic oscillator of the embodiment will be described.

(1) First Embodiment

Figure 5:
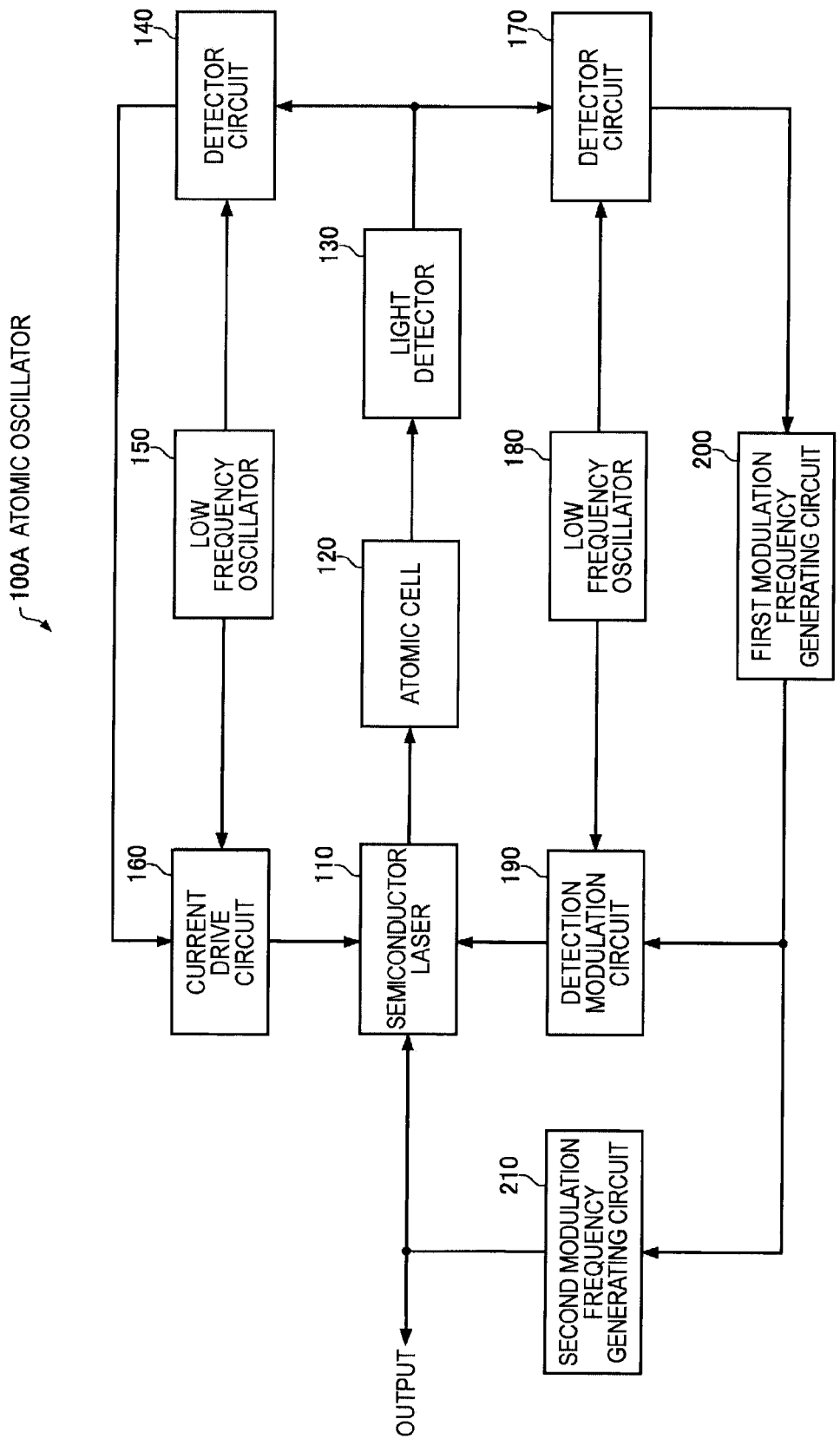
FIG. 5 is a view showing a structure of an atomic oscillator of a first embodiment.

FIG. 5 is a view showing a structure of an atomic oscillator of a first embodiment.

As shown in FIG. 5, the atomic oscillator 100A of the first embodiment includes a semiconductor laser 110, an atomic cell 120, a light detector 130, a detector circuit 140, a low frequency oscillator 150, a current drive circuit 160, a detector circuit 170, a low frequency oscillator 180, a detection modulation circuit 190, a first modulation frequency generating circuit 200 and a second modulation frequency generating circuit 210.

The atomic cell 120 is such that gaseous alkali metal atoms (natrium (Na) atoms, rubidium (Rb) atoms, cesium (Cs) atoms, etc.) are sealed in a container.

When a pair of resonant lights having a frequency difference coincident with a frequency corresponding to an energy difference between two ground levels of the alkali metal atom are simultaneously irradiated to the atomic cell 120, the alkali metal atom causes the EIT phenomenon. For example, when the alkali metal atom is a cesium atom, since the frequency corresponding to the energy difference between the ground level 1 and the ground level 2 in the DI line is 9.19263 . . . GHz, when the pair of resonant lights having the frequency difference of 9.19263 . . . GHz are simultaneously irradiated, the EIT phenomenon occurs.

The semiconductor laser 110 irradiates the laser light including the irradiation light 1 and the irradiation light 2 to the alkali metal atom contained in the atomic cell 120. Specifically, the center frequency $f_0$ (center wavelength $\lambda_0$) of the laser light emitted from the semiconductor laser 110 is controlled by the drive current outputted by the current drive circuit 160, and is modulated by an output signal (hereinafter referred to as a first modulation signal) of the first modulation frequency generating unit 200 and an output signal (hereinafter referred to as a second modulation signal) of the second modulation frequency generating unit 210. That is, the laser light emitted from the semiconductor laser 110 can be modulated by superposing the alternating current having the frequency component of the first modulation signal and the frequency component of the second modulation signal on the drive current of the current drive circuit 160.

Incidentally, the semiconductor laser 110 may be an edge emitting laser, or a surface emitting laser such as a vertical cavity surface emitting laser (VCSEL).

The light detector 130 detects the light passing through the atomic cell 120 and outputs a signal having a signal intensity corresponding to the amount of the detected light. The output signal of the light detector 130 is inputted to the detector circuit 140 and the detector circuit 170.

The detector circuit 140 uses the oscillation signal of the low frequency oscillator 150 oscillating at a low frequency of several Hz to several hundred Hz and synchronously detects the output signal of the light detector 130.

The current drive circuit 160 generates the drive current having a magnitude corresponding to the output signal of the detector circuit 140, supplies the semiconductor laser 110 with the drive current, and controls the center frequency $f_0$ (center wavelength $\lambda_0$) of the laser light. Incidentally, in order to enable the synchronous detection by the detector circuit 140, the oscillation signal (equal to the oscillation signal supplied to the detector circuit 140) of the low frequency oscillator 150 is superposed on the drive current generated by the current drive circuit 160.

The center frequency $f_0$ (center wavelength $\lambda_0$) of the laser light is finely adjusted and stabilized by the feedback loop passing through the semiconductor laser 110, the atomic cell 120, the light detector 130, the detector circuit 140 and the current drive circuit 160.

The detector circuit 170 uses the oscillation signal of the low frequency oscillator 180 oscillating at a low frequency of several Hz to several hundred Hz and synchronously detects the output signal of the light detector 130.

The first modulation frequency generating circuit 200 generates the first modulation signal having a first modulation frequency $f_{m1}$ corresponding to the voltage of the output signal of the detector circuit 170.

The first modulation signal is modulated by the oscillation signal (equal to the oscillation signal supplied to the detector circuit 170) of the low frequency oscillator 180, and is supplied to the semiconductor laser 110. By this, the synchronous detection by the detector circuit 170 is performed while the first modulation frequency $f_{m1}$ is slightly swept, and the first modulation frequency $f_{m1}$ is finely adjusted so that the output signal of the light detector 130 becomes maximum.

The first modulation signal is supplied also to the second modulation frequency generating circuit 210, and the second modulation frequency generating circuit 210 frequency converts the first modulation signal to the second modulation signal having a second modulation frequency $f_{m2}$.

The laser light emitted from the semiconductor laser 110 is modulated by the first modulation signal and the second modulation signal, and the irradiation light 1 and the irradiation light 2 are generated.

Incidentally, the semiconductor laser 110, the atomic cell 120 and the light detector 130 respectively correspond to the light source 10, the atomic cell 20 and the light detection unit 30 of FIG. 1. Besides, a circuit including the detector circuit 140, the low frequency oscillator 150, the current drive circuit 160, the detector circuit 170, the low frequency oscillator 180, the detection modulation circuit 190, the first modulation frequency generating circuit 200 and the second modulation frequency generating circuit 210 corresponds to the control unit 40 of FIG. 1. Besides, the first modulation frequency generating circuit 200 and the second modulation frequency generating unit 210 respectively correspond to the first modulation frequency generating unit 42 and the second modulation frequency generating unit 44 of FIG. 1.

In the atomic oscillator 100A having the structure as stated above, unless the frequency difference between the specified frequency component of the irradiation light 1 emitted from the semiconductor laser 110 and the specified frequency component of the irradiation light 2 accurately coincides with the frequency corresponding to the energy difference between the two ground levels of the alkali metal atom included in the atomic cell 120, the alkali metal atom does not cause the EIT phenomenon. Accordingly, the detection amount of the light detector 130 changes very sensitively according to the frequencies of the irradiation light 1 and the irradiation light 2. Thus, by two feedback loops passing through the semiconductor laser 110, the atomic cell 120, the light detector 130, the detector circuit 170 and the first modulation frequency generating circuit 200 and the detection modulation circuit 190 or the second modulation frequency generating circuit 210, the feedback control is performed so that the frequency difference between the specified frequency component of the irradiation light 1 and the specified frequency component of the irradiation light 2 very accurately coincides with the frequency corresponding to the energy difference between the two ground levels of the alkali metal atom. As a result, since the first modulation frequency and the second modulation frequency become very stable frequencies, the first modulation signal and the second modulation signal can be made the output signal (clock output) of the atomic oscillator 100A.

Figure 6:
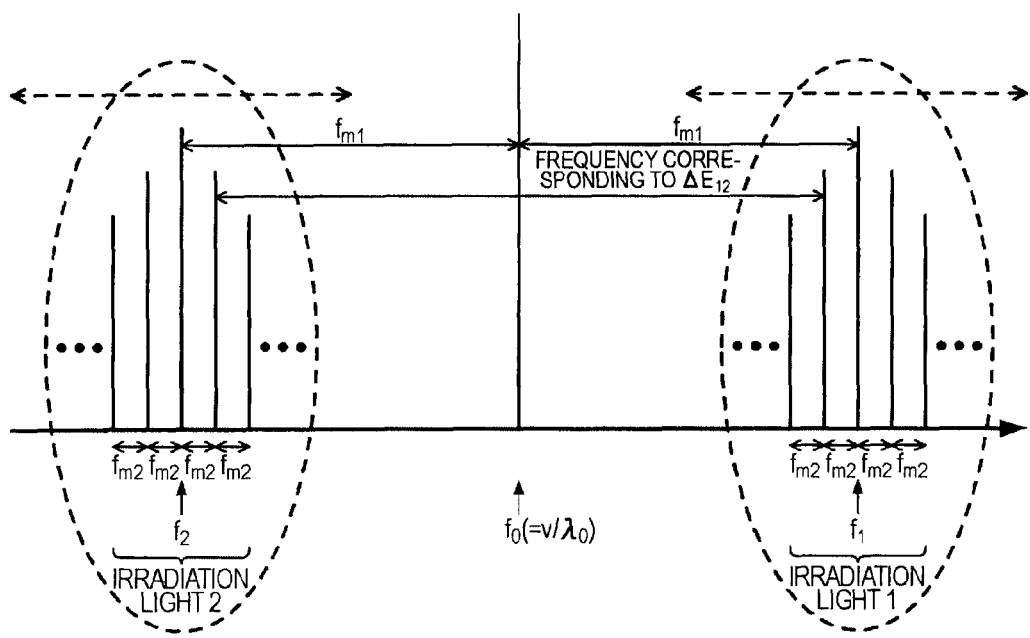
FIG. 6 is a view for explaining an example of an irradiation light 1 and an irradiation light 2 in the atomic oscillator of the first embodiment.

FIG. 6 is a view for explaining an example of the irradiation light 1 and the irradiation light 2 in the atomic oscillator of the first embodiment.

The relation between the irradiation light 1 and the irradiation light 2 shown in FIG. 6 is the same as the relation between the irradiation light 1 and the irradiation light 2 shown in FIG. 2B. However, as in the relation shown in FIG. 3B or FIG. 4B, the relation has only to be such that the frequency difference between the specified frequency component of the irradiation light 1 and the specified frequency component of the irradiation light 2 coincides with the frequency corresponding to the energy difference $\Delta E_{12}$ between the two ground levels of the alkali metal atom (however, the frequency difference between the center frequency $f_1$ of the irradiation light 1 and the center frequency $f_2$ of the irradiation light 2 does not coincide with the frequency corresponding to $\Delta E_{12}$).

According to the atomic oscillator 100A, as shown in FIG. 6, synchronous detection is performed while the entire of the irradiation light 1 having the center frequency $f_1=f_0+f_{m1}$ and frequencies different from each other by $f_{m2}$ and the entire of the irradiation light 2 having the center frequency $f_2=f_0-f_{m1}$ and frequencies different from each other by $f_{m2}$ are swept line-symmetrically with respect to the center frequency $f_0$ ($=v/\lambda_0$) of the laser light, and a stable state occurs when $2\times(f_{m1}-f_{m2})$ coincides with the frequency corresponding to $\Delta E_{12}$.

When the alkali metal atom is a cesium atom, since the frequency corresponding to $\Delta E_{12}$ is 9.19263 . . . GHz, design can be made to achieve stabilization at, for example, $f_{m1}$=4.606315 . . . GHz and $f_{m2}$=10 MHz.

In this case, the first modulation frequency generating circuit 200 can be realized by, for example, an LC resonator in which a resonant frequency can be changed in the vicinity of 4.6 GHz by adjusting inductance (L) or capacitance (C) according to the magnitude of the output signal of the detector circuit 170. Besides, the second modulation frequency generating circuit 210 can be realized by, for example, a direct digital synthesizer (DDS) to down-convert the frequency of the input signal (first modulation signal) by a factor of (10 MHz/4.606315 . . . GHz) and to output it.

Figure 7:
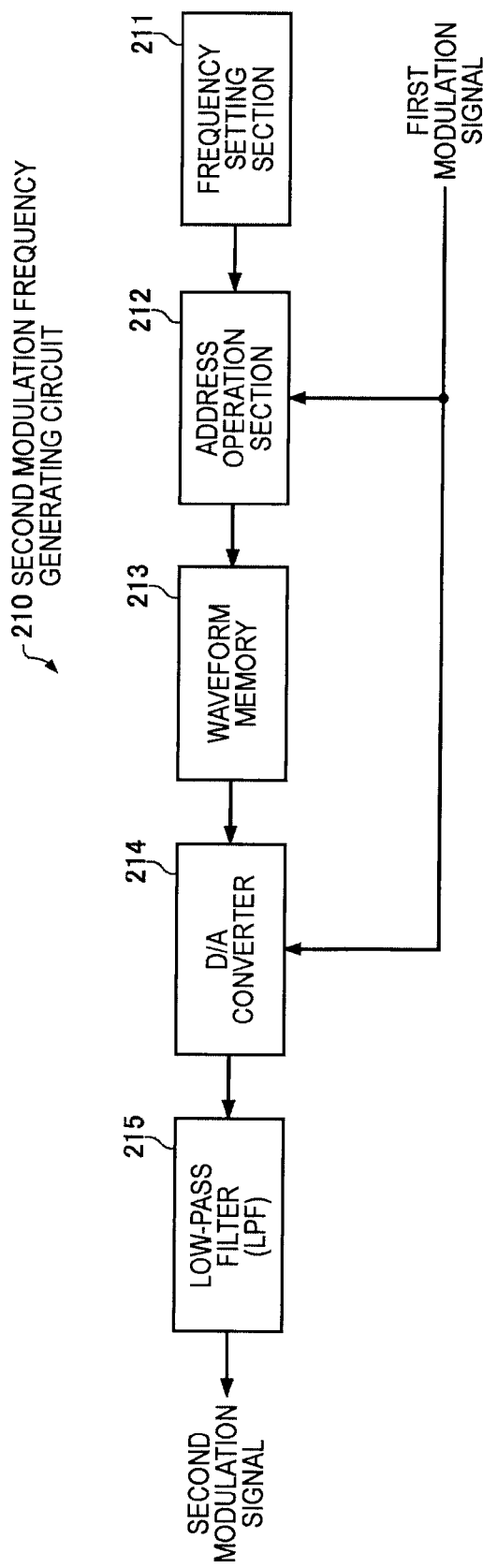
FIG. 7 is a view showing a structural example of a second modulation frequency generating circuit in the atomic oscillator of the first embodiment.

FIG. 7 is a view showing a structural example of the second modulation frequency generating circuit 210 in the atomic oscillator 100A.

As shown in FIG. 7, the second modulation frequency generating circuit 210 is constructed as a direct digital synthesizer (DDS) including a frequency setting section 211, an address operation section 212, a waveform memory 213, a D/A converter 214 and a low-pass filter 215.

The frequency setting section 211 generates additional value data based on previously set frequency data (data for determining a frequency conversion rate). In the former case, the frequency conversion rate is 10 MHz/4.606315 . . . GHz.

The address operation section 212 calculates phase angle data by sequentially adding the additional value data, which is generated by the frequency setting section 211, in synchronization with the first modulation signal. Specifically, the address calculation section 212 adds the additional value data to the previous phase angle data to calculate the current phase angle data, and generate an address corresponding to the phase angle data. The address calculation section 212 can be realized by a p-bit accumulator to repeat the addition process of the additional value data, and the output of the accumulator becomes the address.

The waveform memory 213 stores a correspondence relation between a phase angle of a waveform pattern (for example, sine wave) and an amplitude value. Specifically, the waveform memory 213 stores, in order of address, amplitude value data (digital data) of $2^p$ points obtained by sampling a waveform pattern of one period at regular time intervals (one period/$2^p$), and the amplitude value data stored in an area specified by the address generated by the address operation section is outputted from the waveform memory 213.

The D/A converter 214 D/A converts the amplitude value data outputted by the waveform memory 213. Since the output signal of the D/A converter 214 has a waveform varying stepwise at each period of the first modulation signal, the signal is smoothed by the low-pass filter 215 and the second modulation signal is generated.

By the above structure, the second modulation frequency generating circuit 210 (DDS) outputs the second modulation signal having the frequency $M/2^p$ times larger than the first modulation frequency to the additional value data M generated by the frequency setting section 211. Accordingly, when p is made sufficiently large, the first modulation frequency can be almost accurately multiplied by a factor of (10 MHz/4.606315 . . . GHz). Thus, the second modulation signal having 10 MHz with very high frequency accuracy can be generated.

As described above, in the atomic oscillator of the first embodiment, the control is made such that the frequency difference between the specified frequency component ($f_1+j\times f_{m2}$) of the irradiation light 1 and the specified frequency component ($f_2+k\times f_{m2}$) of the irradiation light 2, that is, ($2\times f_{m1}+(j-k)\times f_{m2}$) (j and k are integers and $j\neq k$) coincides with the frequency corresponding to the energy difference between the two ground levels of the alkali metal atom.

Accordingly, according to the first embodiment, the first modulation frequency $f_{m1}$ and the second modulation frequency $f_{m2}$ satisfying the above condition have only to be selected so that the first modulation frequency $f_{m1}$ or the second modulation frequency $f_{m2}$ become the desired frequency. Thus, as compared with the related art atomic oscillator, the degree of freedom of design is improved, and the atomic oscillator having the comparatively simple structure can be provided.

Modified Example

Figure 8:
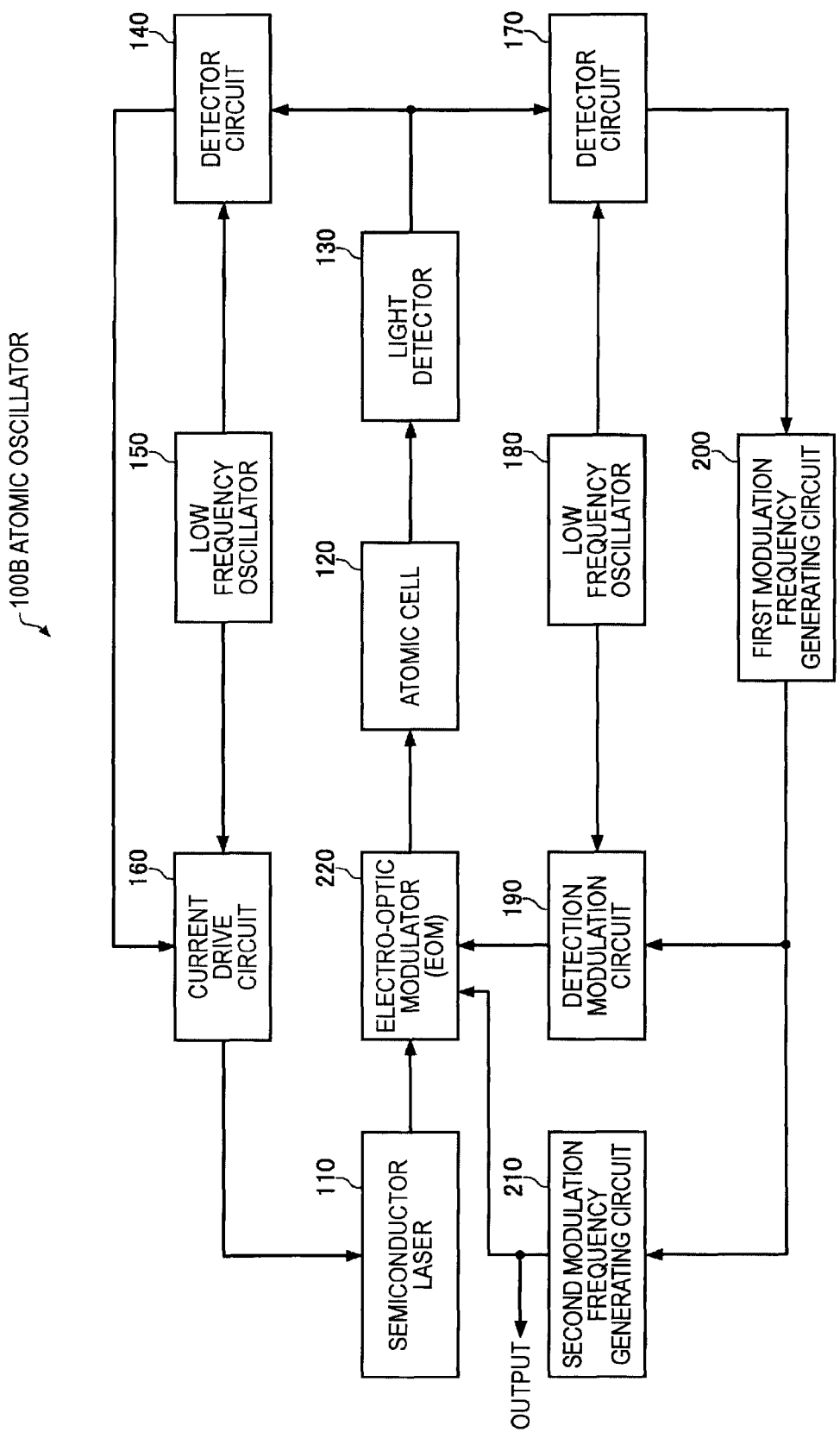
FIG. 8 is a view showing a structure of a modified example of the atomic oscillator of the first embodiment.

FIG. 8 is a view showing a structure of a modified example of the atomic oscillator of the first embodiment. As shown in FIG. 8, in an atomic oscillator 100B of the modified example, an electro-optic modulator (EOM) 220 is added to the atomic oscillator 100A shown in FIG. 5.

As shown in FIG. 8, in the atomic oscillator 100B, a semiconductor laser 110 is not modulated by a first modulation signal having a first modulation frequency $f_{m1}$ or a second modulation signal having a second modulation frequency $f_{m2}$, and emits a laser light having a frequency $f_0$ to the electro-optic modulator (EOM) 220.

The first modulation signal modulated by a detection modulation circuit 190, together with the second modulation signal, is inputted to the electro-optic modulator (EOM) 220.

The electro-optic modulator (EOM) 220 modulates the laser light having the frequency $f_0$ by the first modulation signal and the second modulation signal. As a result, in the light passing through the electro-optic modulator (EOM) 220 and irradiated to the atomic cell 120, similarly to the atomic oscillator 100A shown in FIG. 5, an irradiation light 1 having a center frequency $f_1=f_0+f_{m1}$ and plural frequency components different from each other in frequency by $f_{m2}$ and an irradiation light 2 having a center frequency $f_2=f_0-f_{m1}$ and plural frequency components different from each other in frequency by $f_{m2}$ are generated in an upper side band and a lower side band with respect to $f_0$.

Since the other components in the atomic oscillator 100B shown in FIG. 8 are the same as those of the atomic oscillator 100A, the same reference numerals are given and their explanations will be omitted.

Incidentally, the structure of the semiconductor laser 110 and the electro-optic modulator (EOM) 220 corresponds to the light source 10 of FIG. 1. The other correspondence relations are the same as those of the atomic oscillator 100A shown in FIG. 5.

Also by the structure as stated above, the atomic oscillator having the same function and effects as those of the atomic oscillator A shown in FIG. 5 can be realized.

(2) Second Embodiment

Figure 9:
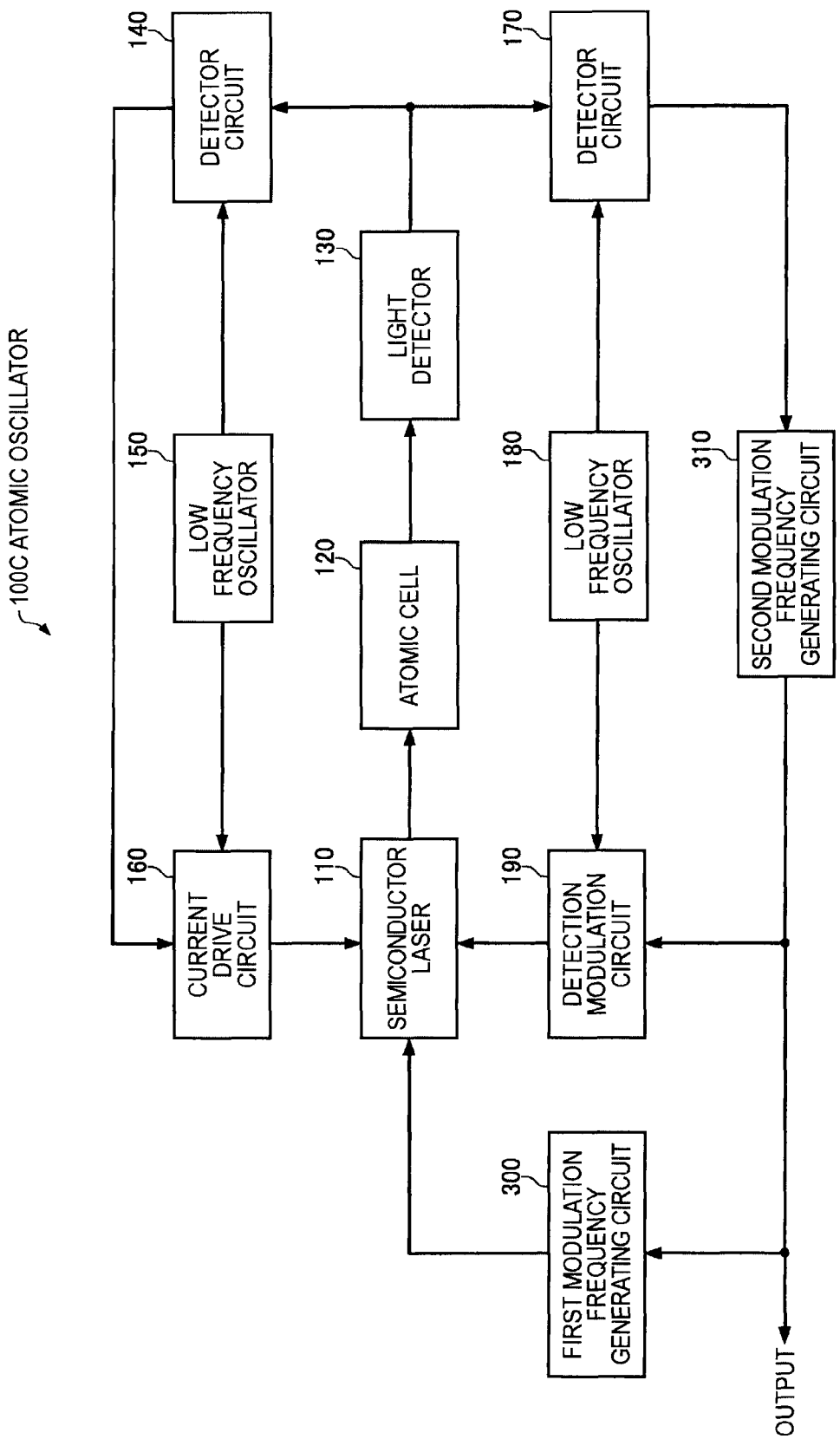
FIG. 9 is a view showing a structure of an atomic oscillator of a second embodiment.

FIG. 9 is a view showing a structure of an atomic oscillator of a second embodiment. As shown in FIG. 9, in the atomic oscillator 100C of the second embodiment, a connection relation between a first modulation frequency generating circuit 300 and a second modulation frequency generating circuit 310 is opposite to the connection relation between the first modulation frequency generating circuit 200 and the second modulation frequency generating circuit 210 in the atomic oscillator 100A of the first embodiment shown in FIG. 5.

In the atomic oscillator 100C, the second modulation frequency generating circuit 310 generates a second modulation signal having a second modulation frequency $f_{m2}$ corresponding to a voltage of an output signal of a detector circuit 170.

The second modulation signal is modulated by an oscillation signal (equal to an oscillation signal supplied to the detector circuit 170) of a low frequency oscillator 180, and is supplied to a semiconductor laser 110. By this, synchronous detection is performed by the detector circuit 170 while the second modulation frequency $f_{m2}$ is slightly swept, and the second modulation frequency $f_{m2}$ is finely adjusted so that the output signal of a light detector 130 becomes maximum.

The second modulation signal is supplied also to the first modulation frequency generating circuit 300, and the first modulation frequency generating circuit 300 frequency converts the second modulation signal to a first modulation signal having a first modulation frequency $f_{m1}$.

The laser light emitted from the semiconductor laser 110 is modulated by the first modulation signal and the second modulation signal, and an irradiation light 1 and an irradiation light 2 are generated.

Since the other components of the atomic oscillator 100C shown in FIG. 9 are the same as those of the atomic oscillator 100A shown in FIG. 5, the same reference numerals are given and their explanations will be omitted.

Incidentally, the semiconductor laser 110, the atomic cell 120 and the light detector 130 respectively correspond to the light source 10, the atomic cell 20 and the light detection unit 30 of FIG. 1. Besides, a circuit including the detector circuit 140, the low frequency oscillator 150, the current drive circuit 160, the detector circuit 170, the low frequency oscillator 180, the detection modulation circuit 190, the first modulation frequency generating circuit 300 and the second modulation frequency generating circuit 310 corresponds to the control unit 40 of FIG. 1. Besides, the first modulation frequency generating circuit 300 and the second modulation frequency generating circuit 310 correspond to the first modulation frequency generating unit 42 and the second modulation frequency generating unit 44 of FIG. 1.

In the atomic oscillator 100C having the structure as stated above, unless a frequency difference between a specified frequency component of the irradiation light 1 emitted from the semiconductor laser 110 and a specified frequency component of the irradiation light 2 accurately coincides with the frequency corresponding to the energy difference between the two ground levels of the alkali metal atom, the alkali metal atom does not cause the EIT phenomenon. Thus, the detection amount of the light detector 130 changes very sensitively according to the frequencies of the irradiation light 1 and the irradiation light 2. Thus, feedback control is performed by two feedback loops passing through the semiconductor laser 110, the atomic cell 120, the light detector 130, the detector circuit 170 and the second modulation frequency generating circuit 310 and the detection modulation circuit 190 or the first modulation frequency generating circuit 300, so that the frequency difference between the specified frequency component of the irradiation light 1 and the specified frequency component of the irradiation light 2 very accurately coincides with the frequency corresponding to the energy difference between the two ground levels of the alkali metal atom. As a result, since the first modulation frequency and the second modulation frequency become very stable frequencies, the first modulation signal and the second modulation signal can be made the output signal (clock signal) of the atomic oscillator 100C.

Figure 10:
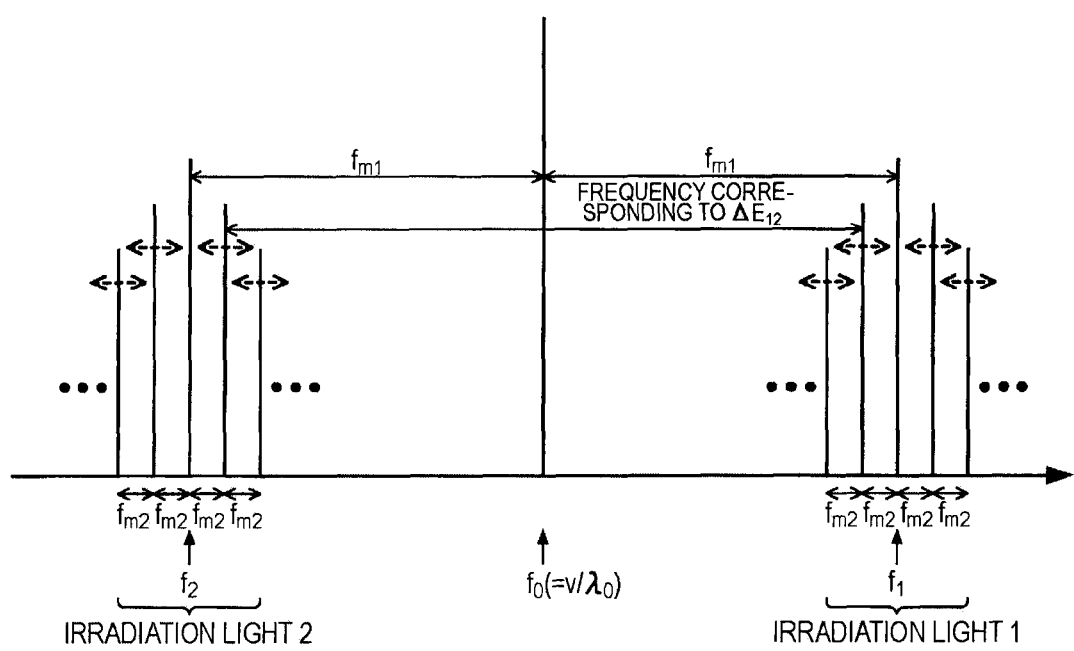
FIG. 10 is a view for explaining an example of an irradiation light 1 and an irradiation light 2 in the atomic oscillator of the second embodiment.

FIG. 10 is a view for explaining an example of the irradiation light 1 and the irradiation light 2 in the atomic oscillator of the second embodiment.

Although the relation between the irradiation light 1 and the irradiation light 2 shown in FIG. 10 is the same as the relation between the irradiation light 1 and the irradiation light 2 shown in FIG. 2B, as in the relation shown in FIG. 3B or FIG. 4B, the relation may be such that the frequency difference between the specified frequency component of the irradiation light 1 and the specified frequency component of the irradiation light 2 coincides with the frequency corresponding to the energy difference $\Delta E_{12}$ between the two ground levels of the alkali metal atom (however, the frequency difference between the center frequency $f_1$ of the irradiation light 1 and the center frequency $f_2$ of the irradiation light 2 does not coincide with the frequency corresponding to $\Delta E_{12}$).

According to the atomic oscillator 100C, as shown in FIG. 10, synchronous detection is performed while the respective frequency components of the irradiation light 1 different from each other in frequency by $f_{m2}$ are swept line-symmetrically with respect to the center frequency $f_1=f_0+f_{m1}$, and the respective frequency components of the irradiation light 2 different from each other in frequency by $f_{m2}$ are swept line-symmetrically with respect to the center frequency $f_2=f_0-f_{m1}$, and stabilization is attained in a state where $2\times(f_{m1}-f_{m2})$ coincides with the frequency corresponding to $\Delta E_{12}$.

When the alkali metal atom is a cesium atom, since the frequency corresponding to $\Delta E_{12}$ is 9.19263 . . . GHz, design can be made to attain stabilization at, for example, $f_{m1}$=4.606315 . . . GHz and $f_{m2}$=10 MHz.

In this case, the second modulation frequency generating circuit 310 can be realized by, for example, a voltage controlled crystal oscillator (VCXO) in which the oscillation frequency can be changed by adjusting the load capacity of a crystal oscillator according to the magnitude of the output signal of the detector circuit 170. Besides, the first modulation frequency generating circuit 300 can be realized by, for example, a PLL to multiply the frequency of the input signal (second modulation signal) by a factor of (4.606315 . . . GHz/10 MHz).

Figure 11:
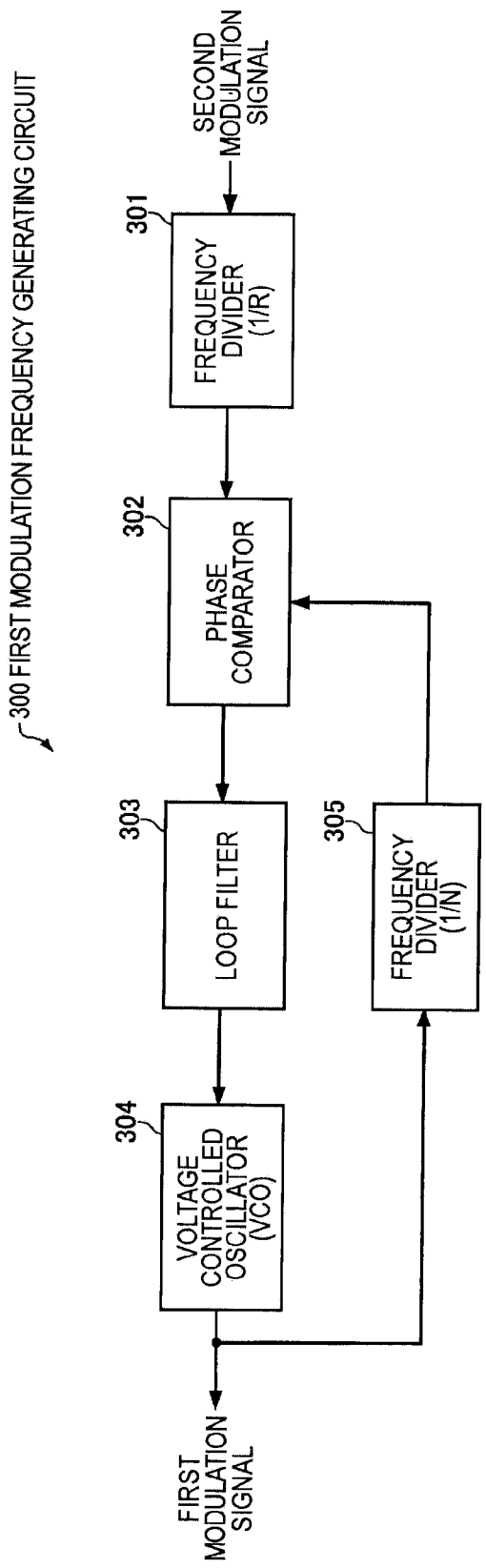
FIG. 11 is a view showing a structural example of a first modulation frequency generating circuit in the atomic oscillator of the second embodiment.

FIG. 11 is a view showing a structural example of the first modulation frequency generating circuit 300 in the atomic oscillator 100C.

As shown in FIG. 11, the first modulation frequency generating circuit 300 is constructed as a PLL including a frequency divider 301, a phase comparator 302, a loop filter 303, a voltage controlled oscillator (VCO) 304 and a frequency divider 305.

The frequency divider 301 divides the frequency (second modulation frequency $f_{m2}$) of the second modulation signal by R (R is a previously determined integer value) and outputs it.

The phase comparator 302 converts a phase difference between the output signal of the frequency divider 301 and the output signal of the frequency divider 305 to a voltage and outputs it.

The loop filter 303 removes a high frequency component contained in the output voltage of the phase comparator 302 (to be exact, it is attenuated to a specific level or less).

The voltage controlled oscillator (VCO) 304 outputs a signal of a frequency corresponding to the output voltage of the loop filter 303.

The frequency divider 305 divides the output frequency of the voltage controlled oscillator (VCO) 304 by N (N is a previously determined integer value) and outputs it.

The output signal of the voltage controlled oscillator (VCO) 304 becomes a first modulation signal (having a first modulation frequency $f_{m1}$).

According to the structure as stated above, since feedback control is performed so that the frequencies of two signals inputted to the phase comparator 302 coincide with each other, that is, $f_{m2}/R=f_{m1}/N$ is established, the first modulation signal of $f_{m1}=(N/R)\times f_{m2}$ is obtained.

When the irradiation light 1 and the irradiation light 2 as shown in FIG. 2A and FIG. 2B are generated, and when the alkali metal atom is a cesium atom, for example, $f_{m1}=4.606315\ldots$ GHz and $f_{m2}=10$ MHz have only to be established. Thus, N and R are determined so that the multiplication ratio N/R becomes (4.606315 . . . GHz/10 MHz).

Besides, when the irradiation light 1 and the irradiation light 2 as shown in FIG. 3A and FIG. 3B are generated, and when the alkali metal atom is a cesium atom, $f_{m1}=4.586315\ldots$ GHz and $f_{m2}=10$ MHz have only to be established. Thus, N and R are determined so that the multiplication ratio N/R becomes (4.586315 . . . GHz/10 MHz).

Besides, when the irradiation light 1 and the irradiation light 2 as shown in FIG. 4A and FIG. 4B are generated, and when the alkali metal atom is a cesium atom, for example, $f_{m1}=4.601315\ldots$ GHz and $f_{m2}=10$ MHz have only to be established. Thus, N and R are determined so that the multiplication ratio N/R becomes (4.601315 . . . GHz/10 MHz).

As described above, in the atomic oscillator of the second embodiment, similarly to the first embodiment, control is performed so that the frequency difference between the specified frequency component $(f_1+j\times f_{m2})$ of the irradiation light 1 and the specified frequency component $(f_2+k\times f_{m2})$ of the irradiation light 2, that is, $(2\times f_{m1}+(j-k)\times f_{m2})$ (j and k are integers and $j\neq k$) coincides with the frequency corresponding to the energy difference between the two ground levels of the alkali metal atom.

Accordingly, according to the second embodiment, the first modulation frequency $f_{m1}$ and the second modulation frequency $f_{m2}$ satisfying the above condition have only to be selected so that the first modulation frequency $f_{m1}$ or the second modulation frequency $f_{m2}$ becomes a desired frequency. Thus, as compared with the related art atomic oscillator, the degree of freedom of design is improved, and the atomic oscillator having the relatively simple structure can be provided.

Besides, in the second embodiment, when the second modulation frequency $f_{m2}$ is determined to be a frequency of MHz band, the second modulation frequency generating circuit 310 or the detection modulation circuit 190 can be realized by a circuit of MHz band. Thus, the design of a microwave circuit requiring high design technology can be significantly omitted.

(3) Third Embodiment

Figure 12:
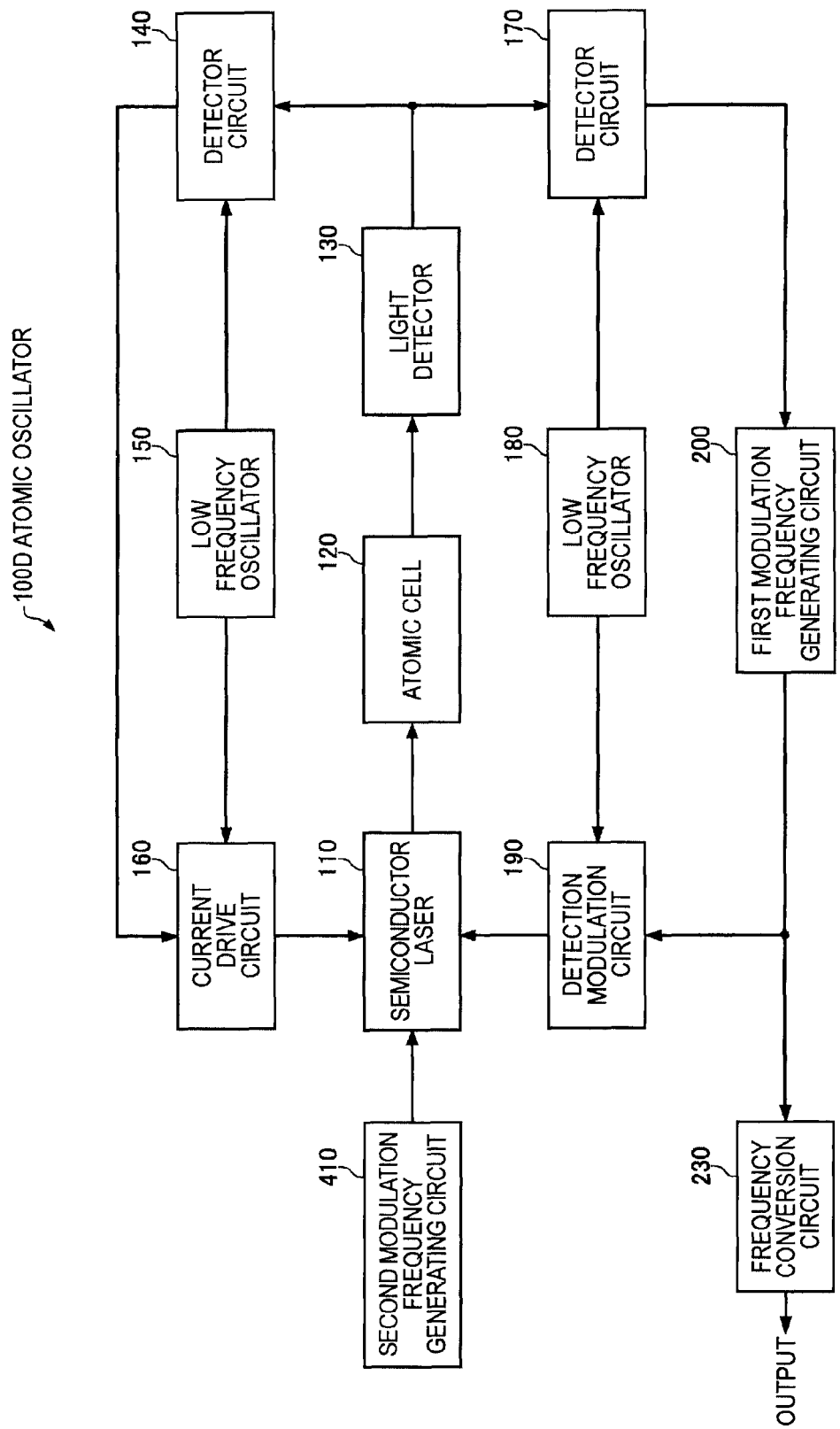
FIG. 12 is a view showing a structure of an atomic oscillator of a third embodiment.
Figure 13A:
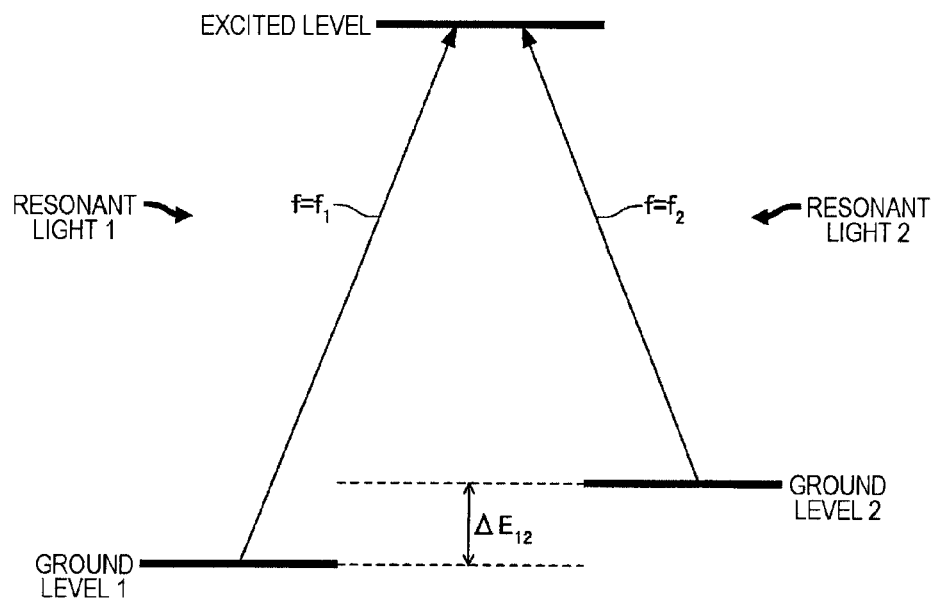
FIG. 13A is a view schematically showing energy levels of an alkali metal atom.
Figure 13B:
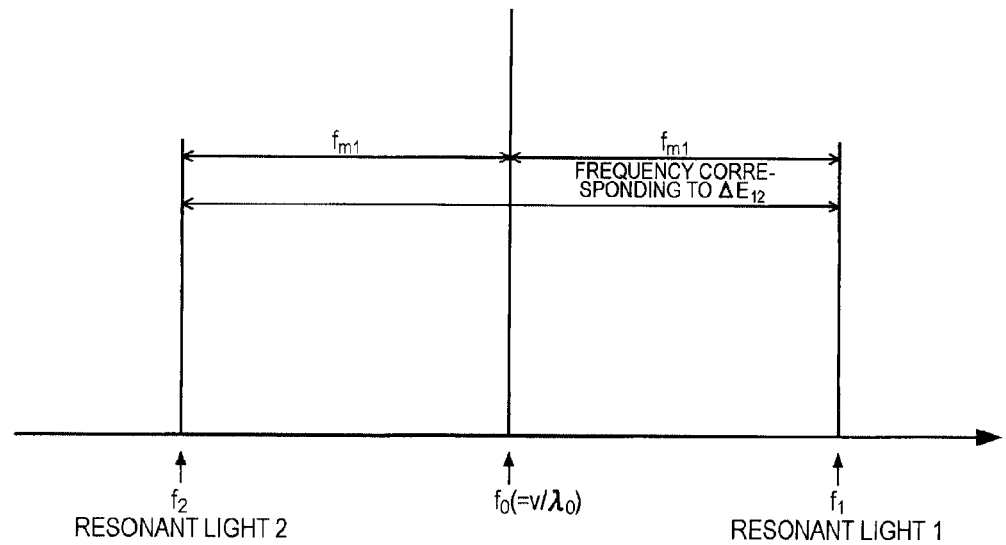
FIG. 13B is a view showing frequency spectra of two resonant lights.
Figure 14:
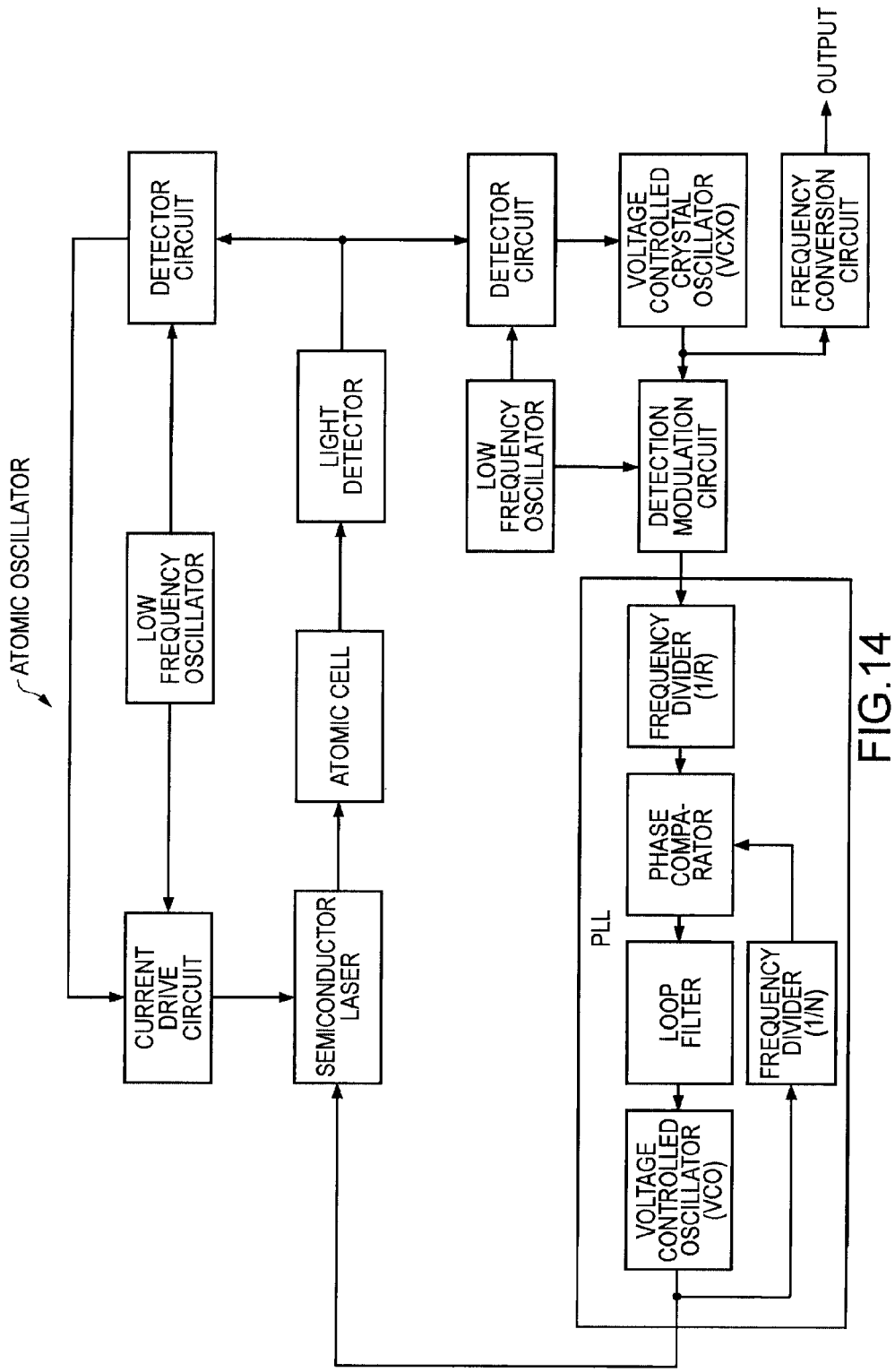
FIG. 14 is a schematic view of a general structure of a related art atomic oscillator of a CPT system.

FIG. 12 is a view showing a structure of an atomic oscillator of a third embodiment. As shown in FIG. 3, the atomic oscillator 100D of the third embodiment is different from the atomic oscillator 100A of the first embodiment shown in FIG. 5 in that a first modulation signal of a first modulation frequency generating circuit 200 is not inputted to a second modulation frequency generating circuit 410. Besides, a frequency conversion circuit 230 is added to the atomic oscillator 100D of the third embodiment.

In the atomic oscillator 100D, the second modulation frequency generating circuit 410 generates a second modulation signal having a second modulation frequency $f_{m2}$ independently of the first modulation signal generated by the first modulation frequency generating circuit 200. The second modulation frequency generating circuit 410 can be realized by, for example, a crystal oscillator (XO) in which load capacity is adjusted so that a crystal vibrator oscillates at the frequency $f_{m2}$.

Laser light emitted from a semiconductor laser 110 is modulated by the first modulation signal and the second modulation signal, and an irradiation light 1 and an irradiation light 2 are generated.

The frequency conversion circuit 230 frequency converts the first modulation signal to a signal having a desired frequency. The frequency conversion circuit 230 can be realized by, for example, a direct digital synthesizer (DDS).

Since the other components of the atomic oscillator 100D shown in FIG. 12 are the same as those of the atomic oscillator 100A shown in FIG. 5, the same reference numerals are given and their explanations will be omitted.

Incidentally, the semiconductor laser 110, the atomic cell 120 and the light detector 130 respectively correspond to the light source 10, the atomic cell 20 and the light detection unit 30 of FIG. 1. Besides, a circuit including the detector circuit 140, the low frequency oscillator 150, the current drive circuit 160, the detector circuit 170, the low frequency oscillator 180, the detection modulation circuit 190, the first modulation frequency generating circuit 200 and the second modulation frequency generating circuit 410 corresponds to the control unit 40 of FIG. 1. Besides, the first modulation frequency generating circuit 200, the second modulation frequency generating circuit 410 and the frequency conversion circuit 230 respectively correspond to the first modulation frequency generating unit 42, the second modulation frequency generating unit 44 and the frequency conversion unit 46 of FIG. 1.

According to the atomic oscillator 100D having the structure as stated above, since the second modulation frequency $f_{m2}$ is fixed, the first modulation frequency $f_{m1}$ is finely adjusted so that the alkali metal atom causes the EIT phenomenon, and the first modulation frequency $f_{m1}$ is converted to a desired frequency and is outputted. Accordingly, according to the third embodiment, since the combination of the first modulation frequency $f_{m1}$, the second modulation frequency $f_{m2}$ and the frequency conversion rate of the frequency conversion circuit 230 can be selected freely to a certain degree in order to obtain a desired frequency, the degree of freedom of design can be improved.

Besides, for example, when the irradiation light 1 and the irradiation light 2 are in the relation shown in FIG. 2A and FIG. 2B, and the alkali metal atom is a cesium atom, and when the frequency (second modulation frequency $f_{m2}$) of the second modulation signal varies in the range of ±1 kHz (±100 ppm) with respect to 10 MHz, the frequency (first modulation frequency $f_{m1}$) of the first modulation signal varies at ±1 k Hz (less than ±1 ppm) with respect to 4.606315 . . . GHz. Accordingly, when the frequency conversion rate of the frequency conversion circuit 230 is set to (10 MHz/4.606315 . . . GHz), the output signal with a frequency accuracy of less than ±1 ppm with respect to 10 MHz is obtained. That is, as compared with the frequency accuracy (±100 ppm) of the second modulation signal, the output signal with the frequency accuracy 100 or more times higher than that can be obtained.

As stated above, according to the atomic oscillator of the third embodiment, the frequency accuracy of the output signal can be greatly improved by using the EIT phenomenon of the alkali metal atom.

Besides, in the atomic oscillator of the third embodiment, when the second modulation frequency generating unit 410 is realized by, for example, a voltage controlled crystal oscillator (VCXO), the second modulation frequency can be changed, and the output signal of the frequency conversion circuit 230 becomes a frequency corresponding to the second modulation frequency. That is, the atomic oscillator in which the output frequency can be changed can be realized.

Incidentally, the invention is not limited to the embodiments, and can be variously modified within the range not departing from the gist of the invention.

For example, in the atomic oscillator of the first embodiment and its modified example, although the second modulation frequency generating circuit 210 is realized by the direct digital synthesizer (DDS), it can be realized by a PLL.

Besides, for example, in the atomic oscillator of the second embodiment, although the first modulation frequency generating circuit 300 is realized by the PLL, it can be realized by a direct digital synthesizer (DDS) with a multiplication function.

The invention includes substantially the same structure (for example, the same structure in function, method and result, or the same structure in object and effect) as the structure described in the embodiment. Besides, the invention includes the structure in which a portion not essential in the structure described in the embodiment is replaced. Besides, the invention includes the structure having the same operation and effect as the structure described in the embodiment or the structure in which the same object can be achieved. Besides, the invention includes the structure in which a well-known technique is added to the structure described in the embodiment.

The entire disclosure of Japanese Patent Application N0.2009-258872, filed Nov. 12, 2009 is expressly incorporated by reference herein.

What is claimed is:

1. An atomic oscillator using an electromagnetically induced transparency phenomenon caused by irradiation of a resonant light pair to an alkali metal atom, comprising:
 a light source that generates a first light having a center frequency $f_1$ and a first plurality of frequency components different from each other in frequency by $\Delta f$, and that generates a second light having a center frequency $f_2$ and a second plurality of frequency components different from each other in frequency by $\Delta f$;
 a light detection unit that detects intensities of lights including the first light and the second light passing through the alkali metal atom; and
 a control unit that controls, based on a detection result of the light detection unit, to cause a first frequency difference between a first specified frequency component of the first light and a second specified frequency component of the second light to be equal to a third frequency corresponding to an energy difference between two ground levels of the alkali metal atom, wherein
 a second frequency difference between the center frequency $f_1$ and the center frequency $f_2$ is different from the third frequency, and
 the first frequency difference is provided by selecting one of the following three combinations (1) through (3) of the first specified frequency and the second specified frequency:
  (1) the first specified frequency is other than the center frequency $f_1$ and the second specified frequency is other than the center frequency $f_2$;
  (2) the first specified frequency is the center frequency $f_1$ and the second specified frequency is other than the center frequency $f_2$; and
  (3) the first specified frequency is other than the center frequency $f_1$ and the second specified frequency is the center frequency $f_2$.

2. The atomic oscillator according to claim 1, wherein the control unit includes
 a first modulation frequency generating unit that generates a first signal having a first modulation frequency $f_{m1}$, based on the detection result of the light detection unit, and
 a second modulation frequency generating unit that generates a second signal having a second modulation frequency $f_{m2}$, and
 the light source modulates a third signal having a third specified frequency $f_0$ based on the first signal and the second signal, and generates the first light and the second light satisfying equations of $f_1=f_0+f_{m1}$, $f_2=f_0-f_{m1}$ and $\Delta f=f_{m2}$.

3. The atomic oscillator according to claim 2, wherein the second modulation frequency generating unit generates the second signal by frequency conversion of the first signal.

4. The atomic oscillator according to claim 2, wherein the second modulation frequency generating unit oscillates at the second modulation frequency $f_{m2}$ independently of the first signal.

5. The atomic oscillator according to claim 4, further comprising a frequency conversion unit that performs frequency conversion of the first signal and generates a fourth signal having a fourth specified frequency.

6. The atomic oscillator according to claim 1, wherein the control unit includes
 a second modulation frequency generating unit that generates a second signal having a second modulation frequency $f_{m2}$ based on the detection result of the light detection unit, and
 a first modulation frequency generating unit that generates a first signal having a first modulation frequency $f_{m1}$ by frequency conversion of the second signal, and
 the light source modulates a third signal having a third specified frequency $f_0$ based on the first signal and the second signal, and generates the first light and the second light satisfying equations of $f_1=f_0+f_{m1}$, $f_2=f_0-f_{m1}$ and $\Delta f=f_{m2}$.

* * * * *